United States Patent [19]
Fredrickson et al.

[11] Patent Number: 5,548,600
[45] Date of Patent: Aug. 20, 1996

[54] METHOD AND MEANS FOR GENERATING AND DETECTING SPECTRALLY CONSTRAINED CODED PARTIAL RESPONSE WAVEFORMS USING A TIME VARYING TRELLIS MODIFIED BY SELECTIVE OUTPUT STATE SPLITTING

[75] Inventors: Lisa Fredrickson, Sunnyvale; Razmik Karabed, San Jose; Paul H. Siegel, San Jose; Hemant K. Thapar, San Jose, all of Calif.

[73] Assignee: International Business Machines Corporation, Armonk, N.Y.

[21] Appl. No.: 316,597

[22] Filed: Sep. 29, 1994

Related U.S. Application Data

[63] Continuation-in-part of Ser. No. 289,811, Aug. 12, 1994.
[51] Int. Cl.⁶ .......................... G06F 11/10; H03M 13/12
[52] U.S. Cl. .......................... 371/43; 375/254; 375/265; 375/290
[58] Field of Search .......................... 371/43, 44, 45, 371/30, 55; 341/55, 56, 58, 59, 94; 375/254, 265, 290, 242

[56] References Cited

U.S. PATENT DOCUMENTS

| | | | |
|---|---|---|---|
| 4,888,779 | 12/1989 | Karabed et al. | 371/43 |
| 5,095,484 | 3/1992 | Karabed et al. | 371/30 |
| 5,208,834 | 5/1993 | Fredrickson | 375/242 |
| 5,214,672 | 5/1993 | Eyuboglu et al. | 375/254 |
| 5,257,272 | 10/1993 | Fredrickson | 371/43 |
| 5,280,489 | 1/1994 | Fredrickson et al. | 371/45 |
| 5,331,320 | 7/1994 | Cideciyan et al. | 341/56 |

OTHER PUBLICATIONS

"High–Speed Parallel viterbi Decoding: Algorithm and VLSI–Architecture" IEEE Communications Magazine, May 1991 pp. 46–55.

*Primary Examiner*—Roy N. Envall, Jr.
*Assistant Examiner*—Emmanuel L. Moise
*Attorney, Agent, or Firm*—Baker, Maxham, Jester & Meador

[57] ABSTRACT

A method and means for detecting spectral null sequences of a spectrally-constrained code at the output of a noisy communications channel by tracking the spectral content of said sequences with a Viterbi detector using an N stage trellis and mapping each spectral null sequence to a unique path of acyclic successive states and edges through said trellis by selectively outsplitting counterpart states at preselected times modulo N in said trellis such that no pair of unique paths support the same spectral null sequence.

11 Claims, 13 Drawing Sheets

METHOD AND MEANS FOR GENERATING AND DETECTING SPECTRALLY CONSTRAINED CODED PARTIAL RESPONSE WAVEFORMS USING A TIME VARYING TRELLIS MODIFIED BY SELECTIVE OUTPUT STATE SPLITTING

CROSS REFERENCE TO RELATED APPLICATIONS

This application is a continuation in part to the copending application of Siegel et. al., U.S. Ser. No. 08/289,811, filed Aug. 12, 1994, entitled "MATCHED SPECTRAL NULL CODES WITH PARTITIONED SYSTOLIC TRELLIS STRUCTURES".

FIELD OF THE INVENTION

This invention relates to the coding of sequences of waveforms, and more particularly, to methods and means for generating and detecting spectrally constrained sequences of coded waveforms at the output of a noisy partial response channel using a modified Viterbi detector.

DESCRIPTION OF RELATED ART

Partial Response Channel Coding

It is well appreciated that an unconstrained binary information sequence can be applied to a path or channel for recording onto tracked magnetic or optical storage devices. Such a sequence may likewise be read back from such devices over the same or other path or channel. When a sequence must travel on the channel through even small amounts of additive white Gaussian noise, jitter, and/or intersymbol interference (ISI) then the sequence may be sensed as a distorted or corrupted series of waveforms at the channel output. These distortions increase as the signal repetition frequency of a sequence in a band limited channel increases.

ISI arises out of the sequential transmission of a set of time varying waveforms in a channel at a rate exceeding the capacity of the channel to quiesce. This means either that not all of the frequency components of a unitary waveform are propagated through a channel at the same speed or some waveform components are phase delayed more than others. Thus, at any point in time, a channel will output some components of a second signal before all the components of a prior signal have terminated. That is, a system with a bandwidth of $W=1/(2T)=R/2$ Hz can support a maximum transmission rate of $2W=1/T=R$ symbols per second without ISI.

To thwart these channel inspired obstacles, each binary information sequence can be mapped into a specially coded and shaped series of waveshapes. One such coding and shaping termed "partial response" or "duobinary" signal shaping uses a controlled amount of ISI to eliminate any adverse effects through self cancellation. As each bit of a binary information sequence is applied to a partial response encoder, an expanded number of output signal choices can be made as a function of the current state of the encoder as well as the current input. This form of coding distributes information of each of the bits in the unconstrained binary sequences over a larger number of symbols in the PR coded sequence.

As mentioned above, PR coding introduces a controlled amount of ISI between successive symbols in a sequence such that the ISI "cancels out" at a channel output detector. Relatedly, one advantage of the PR coding is that symbols may be "packed" more densely up to the maximum theoretical rate of 2 symbols/cycle. A channel supporting PR coding or "signaling" when viewed as a filter is said to have a transfer function in the time domain of the form (1−D) where D is a unit of time delay. Other PR transfer functions pertinent to digital recording are of the form $(1-D)*(1+D)^N$, where N=1,2,3, etc. One frequently used form of PR corresponding to the case N=1, is termed "Class 4 partial response". It connotes a channel having a $1-D^2$ transfer function. This means that an output $y_n$ is related to a pair of inputs $x_n$ and $x_{n-2}$ as $y_n=x_n-x_{n-2}$. This can also be expressed as a pair of interleaved sequences covering $x_0,x_2,\ldots,x_{2i}$ and $x_1,x_3,\ldots,x_{2i+1}$. The PR Class 4 coding uses maximum likelihood detection. This is known in the literature by the acronym PRML for "Partial Response Maximum Likelihood".

Finite State Machines And Trellises

The term "trellis" is a paradigm in channel codes for projecting a finite state machine onto a directed graph of nodes and edges. The graph is replicated over time such that a "walk" over the nodes and edges represents one or more responses of the machine to an input (event) symbol sequence. PR encoding may be expressed as a finite state machine with memory and mapped onto a "trellis" when considering its behavior over time.

Fettweis et al, "High Speed Parallel Viterbi Decoding", IEEE Communications Magazine, May 1991, pp.46–55, points out more formally that a trellis shows the transition dynamics in the form of a two dimensional graph for any given discrete-time finite state machine with N states where the transition diagram and transition rate of 1/T are constant in time. This graph is described in the vertical direction in N states s(i) and in the horizontal direction by time instances kT(T=1). The states of time instance k are connected with those of time k+1 by the branches of the time interval (k,k+1).

PR Coding, Viterbi Detection, And Distance Between Sequences

PR encoding of a binary information sequence is a type of convolutional encoding. That is, the state of a coder convolves with each sequence of input bits through successive states to produce an expanded shaped multibit waveform output sequence. This is applied to a channel and recorded on a magnetic or optical storage medium. Where the recorded sequence is read or played back from the medium, one issue is whether the sequence that was originally channel encoded and is the same as the one that has been read back. This function is termed "detection". In this specification the term "decoding" is reserved for the conversion of a spectrally constrained partial response coded sequence into a binary information sequence.

Given a convolutionally or PR encoded sequence at the output of a channel that has possibly been changed by noise, then maximum likelihood detection compares the received sequence against all possible legal outcomes in terms of their "distance" from the received sequence. One way to reduce error is to ensure that the "distances" between legal sequences are large and that distances along each path through the trellis accumulate quickly.

There are several types of distance measures. For block codes the Hamming distance is the number of symbols in disagreement between any two codewords. For convolutional codes, another distance measure is often used. This is termed "Euclidean distance" and is defined as the minimum sum of the squared differences between sequences of noiseless sample values resulting from two distinct path that diverge from a common state on a trellis and re-merge to a common state. Since PRML Class 4 signaling generates codewords convolutionally, it uses the latter distance measure and detects codewords having a minimum distance of 2. Parenthetically, a minimum distance of 4 between matched spectral null type partial response code sequences can maintained.

A Viterbi detector selects a code sequence which most resembles the received code sequence among those generated by the encoder. This is done by logically projecting the encoder states over time onto a trellis and walking through one or more of the logical paths likely to have been one originally traveled by the encoder. Such a path or paths are called maximum likelihood path or paths. This path is established not by comparing all paths with each other but by obtaining a Hamming distance or other distance measure between all code sequences generated by the encoder and the received sequence. The object is to select the path having the smallest Hamming distance cumulative value or other "minimum distance" cumulative value for PRML codes sequences. It is necessary only to track those paths which are necessary for detection called "surviving paths" with high probability. When the lengths of the surviving paths are sufficiently long their roots will join to the same state indicating that each surviving path retrospectively decodes the same value. This is the same problem as that of finding the shortest path through a weighted directed graph.

Fettweis reference also notes that the Viterbi detector is a finite state machine. Its behavior can be expressed in the form of a trellis. In detection, the Viterbi detector chooses a path through the trellis as a function of the state transitions and the branch metrics in time interval (k,k+1). An optimum path through the trellis is determined recursively by the detector by computing a value for each path counterpart to each of the N states or nodes at time k. The N new optimum paths of time k+1 are a function of the metrics of the old paths and the branch metrics of the interval (k,k+1). That is, at any time k there is recursively computed a path metric for each node which represents a maximum or a minimum of the metrics of all paths terminating in that node depending on the manner of formulating the computation. A unique or best path of the set of N decoded paths through the trellis is obtained by selecting the one path which has the minimal distance metric among the set of N.

The selection of surviving path is performed for all states. Thus, the detector advances deeper onto the trellis making decisions by eliminating less likely paths. The early rejection of less likely paths reduces detector complexity. The objective of selecting the optimum path can be considered either as choosing the codeword with the "maximum likelihood metric" or choosing the codeword with the "minimum distance metric".

Catastrophic and Quasi-Catastrophic Sequences

The literature describes "catastrophic sequences" as errors in or after encoding that drive a detector into an infinite error loop. In a convolutional coder, a "catastrophic sequence" is one where its state diagram contains a zero weight cycle different from the loop attached to the zero state. That is, the state diagram has a cycle, other than the loop on the zero state, in which every directed edge is labeled with a zero output. Thus, a finite number of errors in transmission result in an infinite number of detection errors.

A sequence belonging to a trellis is said to be "quasi-catastrophic" in the context of PR channels if it can be generated by at least two distinct walks on the trellis. As a consequence, the evidence of quasi-catastrophic sequences is manifest by sequences generated by paths diverging from a specified state such that a minimum distance measure cannot be accumulated within a fixed finite number of samples or detector state changes. On the binary-input 1–D channel, the pairs consisting the all zeros sequence and the sequence containing a one followed by a run of zeros are illustrative of this behavior.

Coding Gain, Matched Spectral Nulls, Minimum Distance, Viterbi Detection, And Path Elimination of Quasi catastrophic sequences Karabed, et. al., U.S. Pat. No. 4,888,779, "Matched Spectral Null Trellis Codes For Partial Response Channels", issued Dec. 19, 1989 discloses a method and means for improving the coding gain of each coded waveform signal. Relatedly, "coding gain" is the reduction, expressed in decibels, in the required ratio of bit energy to noise power spectral density ($E_b/N_0$) to achieve a specified error performance of an error correcting coded system over an uncoded one with the same modulation. This is accomplished in part by using codes designed to match the spectral nulls in the PR channel response polynomial. First, each frequency at which there is a zero in the transfer function of a partial response channel is determined. Next, each binary input sequence is mapped into a coded binary sequence having a power spectrum value of zero for each such frequency. The frequencies at which the power spectrum value is zero are termed "spectral null frequencies". The codes so generated are termed "first order" matched spectral null (MSN) codes.

Use of first order MSN codes increases the reliability of PR channels by increasing the "minimum distance" between coded output sequences from 2 to 4. Also, Karabed et. al. eliminates some quasi-catastrophic sequences by reducing the required path memory and increasing the complexity of the encoder and detector.

Fredrickson et. al., U.S. Pat. No. 5,280,489, "Time-varying Viterbi Detector For Control Of Error Event Length", issued Jan. 18, 1994, introduced time variation into the detector trellis by removing specific edges and states from the systolic trellis structure derived from the canonical spectral null trellis. This time varying structure reduces error event length in detection of codes with spectral nulls by eliminating paths corresponding to selective quasi-catastrophic sequences.

While the selective deletion eliminates duplicate paths generating quasi-catastrophic sequences, it also eliminates many paths generating sequences that might have supported acceptable codewords. Consequently, the achievable code rate supported by the modified trellis is reduced. Thus, in order to maintain a high code rate, it was necessary to either increase the codeword block length or the number of trellis states resulting in enhanced code and detector complexity.

SUMMARY OF THE INVENTION

It is an object of this invention to devise a reduced complexity method and means for generating and detecting matched spectral null (MSN) coded sequences, the sequences being constrained such that their spectral nulls match those of the partial response channel transfer function over which the sequences are received.

It is a related object that such method and means generate and detect the most likely MSN sequence, the sequences being separated by at least a minimum distance, the generation and detection using a trellis with reduced truncation depth.

It is still another object that such method and means generate and detect MSN sequences with the constraints against quasi-catastrophic sequences (QCS) without requiring substantial path memory to assure high probability of a survivor path merging.

It is yet another object that such method and means be used with any one of several rate 8/10 codes.

The foregoing objects are satisfied by a method and means for detecting spectral null sequences of a spectrally-constrained code generated at the output of a noisy partial response communications channel. In the invention, the spectral content of the sequences are tracked with a Viterbi detector. Relatedly, each sequence is mapped to a unique path of acyclic successive states and edges through the detector trellis by selectively outsplitting counterpart states at preselected times modulo N in the trellis. The outsplitting is constrained such that no pair of unique paths support the same codeword sequence. The steps are recursively applied creating thereby a time-varying trellis structure for limiting the maximum length of dominant error events in a sequence.

The trellis T' in the Viterbi detector and the encoder originating the sequences is the image of states and edges from a primitive trellis T. T supports all sequences therethrough. However, trellis T' is constrained such that a subset of its states are selectively outsplit at various times t from counterpart states in T. It is further constrained such that preselected edges in T' supportive of quasi-catastrophic spectral null codeword sequences are deleted.

The output splitting of states s in time t of trellis T to form the image trellis T' includes (a) replacing a state s at a time t by two states s' and s";

(b) reproducing the in-directed edges of s for both the states s' and s"; and (c) partitioning the out-directed edges of s into two sets assigning a first set to state s' and a second set to state s".

The generation and detection of matched spectral null (MSN) coded sequences on a partial response channel is enhanced using the modified trellis T' because sequences that contribute to a large truncation depth can be eliminated by pruning of selected states and/or edges without substantial loss in code rate or substantial increase in either the code generation or detector complexity.

BRIEF DESCRIPTION OF THE DRAWING

The forgoing features and advantages of the invention may be better understood and appreciated from a detailed description of at least one embodiment thereof when taken together with the figures of the drawing in which.

DESCRIPTION OF THE PREFERRED EMBODIMENT

Figure 1A:
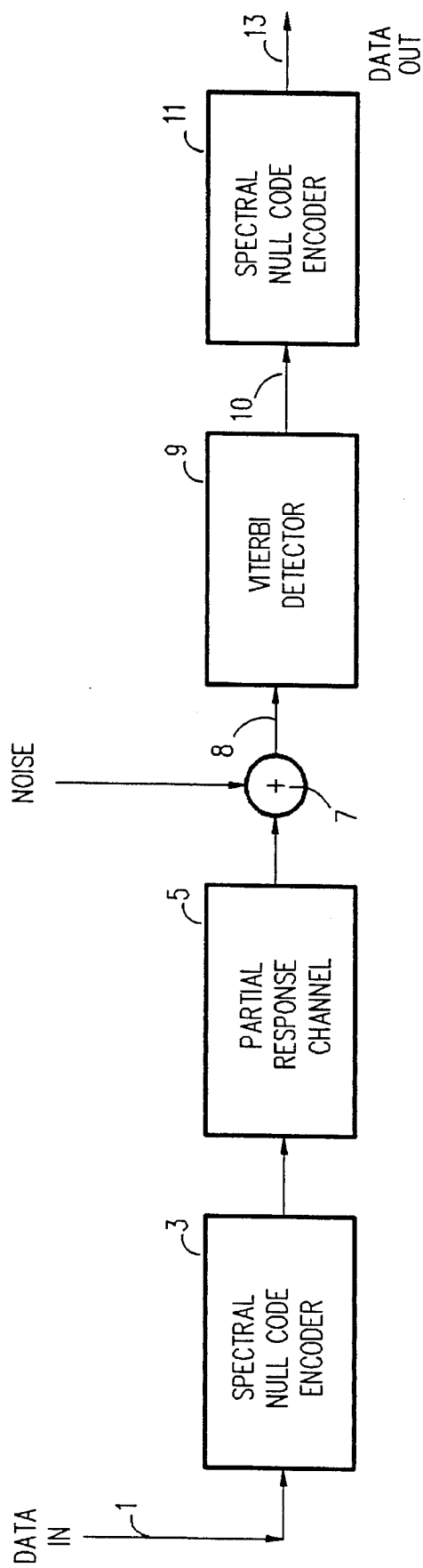
FIG. 1A shows a logic block diagram of a spectral null coded encoder, partial response channel, a Viterbi detector, and a spectral null code decoder according to the prior art.

Referring now to FIG. 1A, there is shown a logic block diagram of a spectral null coded encoder, partial response channel, a Viterbi detector, and a spectral null code decoder according to the prior art. As depicted, input data, such as in the form of binary symbol strings, is transmitted from a path 1 to encoder 3. Encoder 3 is a finite state machine (FSM) that generates spectral null sequences that serve as input to a communications channel 5 such as a partial response channel or a full response channel. These spectral null sequences have a power spectrum of zero for each frequency at which there is a zero in the transfer function of the channel 5; i.e., the code sequences have spectral nulls which match those of the channel.

A channel output sequence that is subject to noise is generated by channel 5 and detected at the channel output 8 by a Viterbi detector 9 embodying the invention. Viterbi detector 9 detector calculates the most probable code sequence from the channel output sequence. Detector 9 reduces computational and hardware requirements by tracking only the frequency spectral content of the channel output sequence, thereby producing a near maximum-likelihood estimate (or most probable code sequence) of the transmitted original data sequence supplied via path 1. A sliding block spectral null code decoder 11 in the form of a look up table or FSM decodes the matched spectral null sequences on path 10 to provide, as an output, user data output path 13.

Figure 1B:
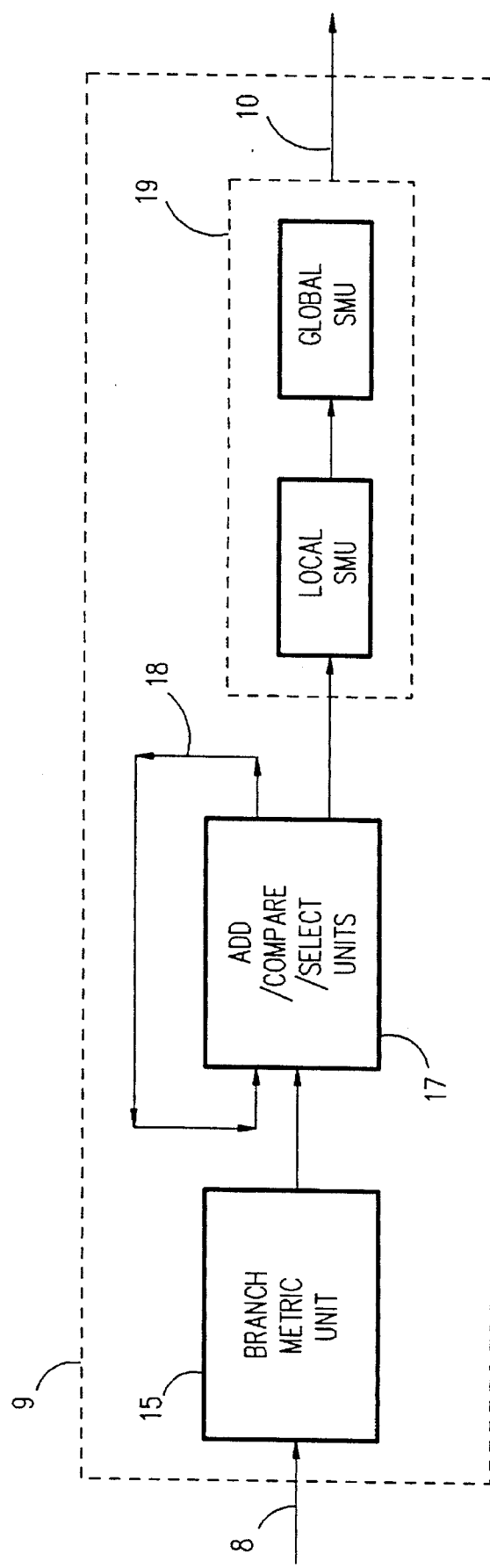
FIG. 1B sets out a prior art logic block diagram of a Viterbi detector.

Referring now to FIG. 1B, there is shown a logic organization of a Viterbi detector 9. The detector comprises a branch metric unit (BMU) 15, an add_compare_select unit (ACSU) 17 with a recursive or feed back path 18, and a survivor_memory_unit (SMU) 19. The ACSU 17 processes each of the spectral null coded sequences as represented by branch metrics as if it were along a trellis. This is done in a recursive computational manner. The most likely paths (sequences of MSN partial response signals originally encoded) are stored on the SMU as the detection proceeds with the best guess or most likely estimate being applied to the detector output. The term "path" is appropriate since each possible symbol sequence has a unique path through the trellis.

It is well appreciated that for example in any convolutionally generated sequence that for any node in a trellis representation of Viterbi detection, there are two paths entering the node. Since those paths will be identical from that point on, a maximum likelihood detector may make a decision at that point with no loss in performance. That is, the Viterbi detector 9 compares the two paths entering a node and only the path with the best metric is retained. The other path is discarded since its likelihood can never exceed that of the path which is retained no matter what data are subsequently received. The retained paths are called SURVIVORS.

It should be noted that unlike the classic backward recursion direction of dynamic programming, the Viterbi detection algorithm is applied to convolutional codes recursively in a forward direction. That is, from first stage to last stage.

Figure 2A:
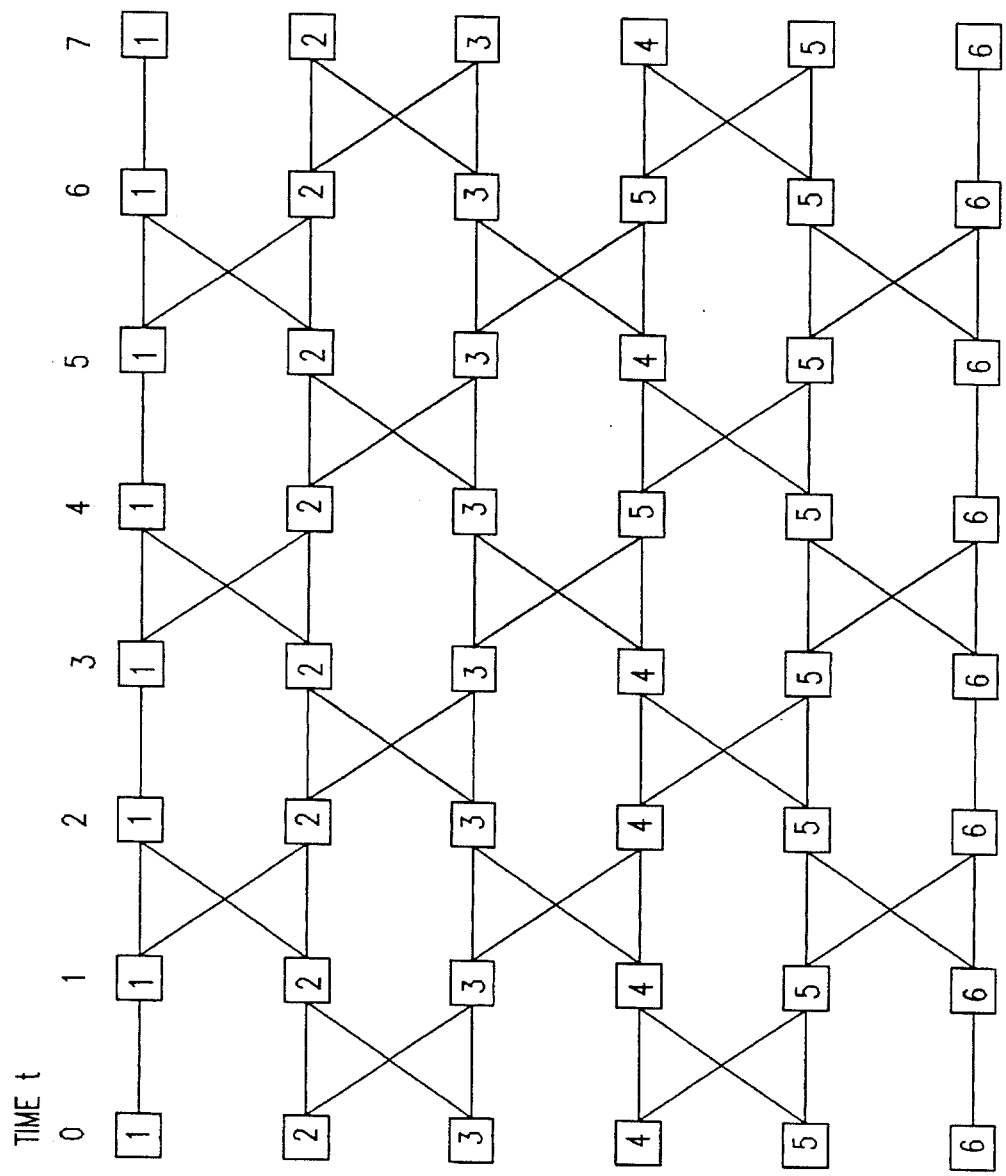
FIGS. 2A and 2B respectively illustrate a primitive trellis T and its constrained image trellis T', the latter being used for encoding and detecting spectral null coded sequences.
Figure 2B:
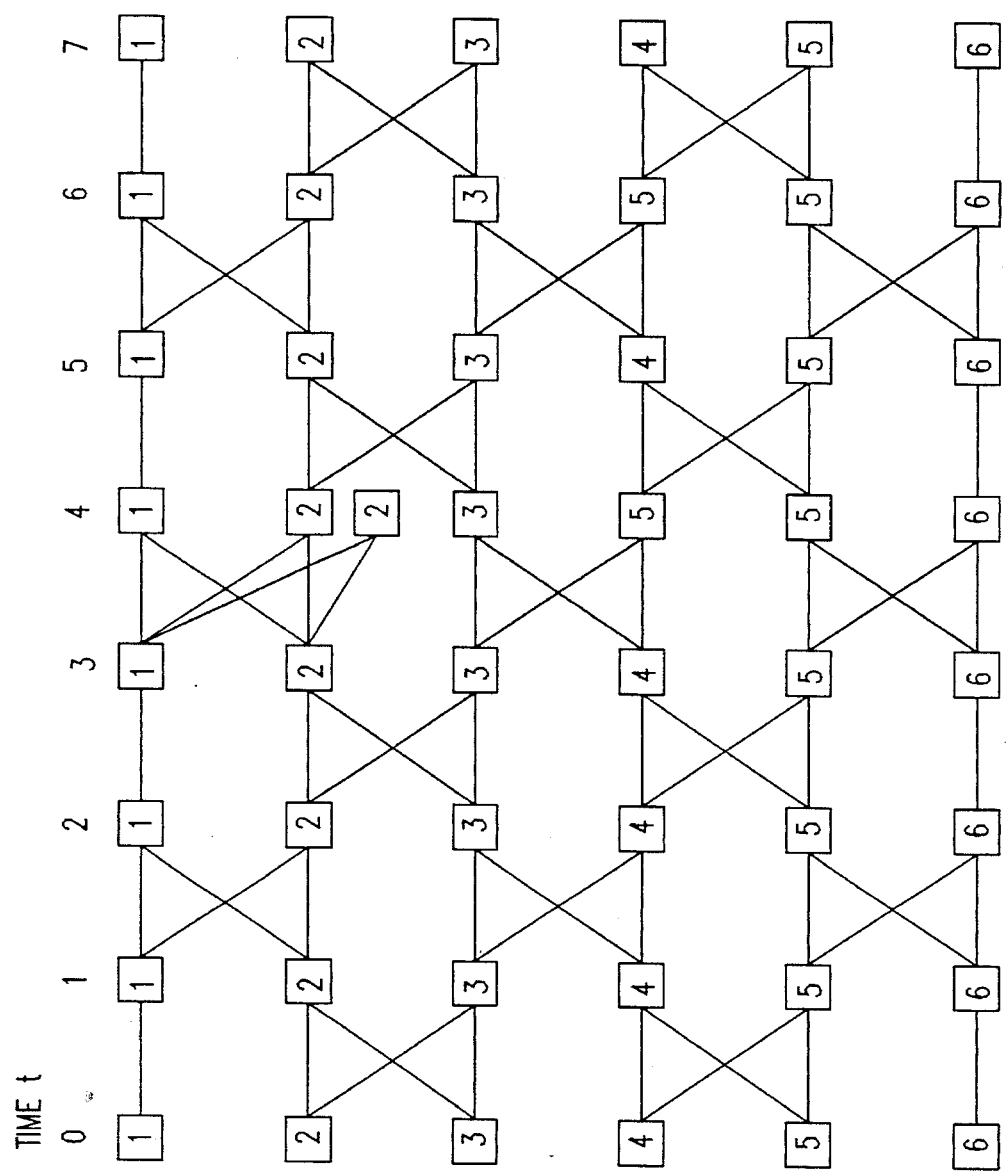

Referring now to FIGS. 2A and 2B, there is respectively illustrated a primitive trellis T and its constrained image trellis T', the latter being used for encoding and detecting spectral null coded sequences. For every time t, there is a list of states in a column which are accessible at the time t on the trellis. As may be recalled, a trellis is a finite state diagram projected onto a directed graph of nodes representing the states and edges representing the transitions over successive discrete time intervals.

Stated another way, in the trellis diagrams, each state, at time t, is represented by a numbered square. The trellis is connected to a set of states at time t+1 by arcs (or lines) that have labels from a finite set L (labels are omitted in the Figure). A sequence of labels is said to belong to the trellis T if it can be generated by walking from a state to a state on T along the connectivity lines and reading off the labels.

For an integer K, a trellis T is called K-regular (or K-block stationary) if the connectivity of the states at time t is the same as at time t+K. When K=1, the trellis T is simply called regular (or stationary).

Referring again to FIG. 2A, in a trellis T, suppose it is desired to replace a state s at a time t by two states s' and s". It is also desired to reproduce the incoming connectivity picture of s for both of the states s' and s". Finally, it is also desired to partition the lines out of state s into two sets and give one set to each of the states s' and s". The resulting trellis T' is equivalent to T, in the sense that both trellises represent the same labeled sequences. It is said that T' is obtained from T by out-splitting the state s at time t. FIG. 2B illustrates a trellis T', where T' is obtained from T by out-splitting state 2 at time 4.

It is desired to ascertain whether trellis T is stationary. If a state s in T is out-split for every time t, then the resulting trellis T' also will be stationary. Further, if T is K-block stationary, and if a state s in T is out-split for every time t=t$_0$ (mod K), then the resulting trellis T' also will be K-block stationary.

A trellis T comprising all possible or allowable code sequences often contains some further sequences that hurt the performance of certain communication systems that utilize T to decode the code. Having these additional sequences on the trellis degrades the performance, because they sometimes create: a long path memory, a loose representation of the code or quasi-catastrophic behavior. In such cases, it is desirable to prune all the unwanted sequences that appear on T. In this regard, the modification of a trellis by selectively out-splitting states or nodes thereof is a highly selective pruning technique.

The modifications to a primitive trellis T by output state splitting prescribes:
1. Out-splitting of T to obtain a trellis T'.
2. Eliminating of certain edges from T' to hinder support of undesirable sequences.

As illustrative examples of the enablement of the method and means of this invention, three trellises pertaining to three variations of the same rate code are described. The trellis codes so referenced are denominated C1, C2, and C3.

A Channel Code Design Utilizing Outsplitting

Figure 3:
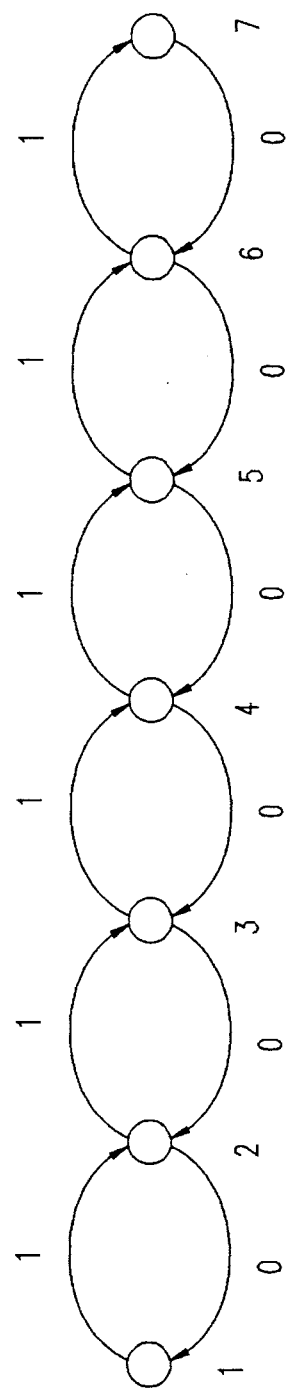
FIG. 3 depicts a $G_7$ finite state transition diagram (FSTD) for a seven state subset of a canonical FSTD used in generating spectral null coded sequences.
Figure 4:
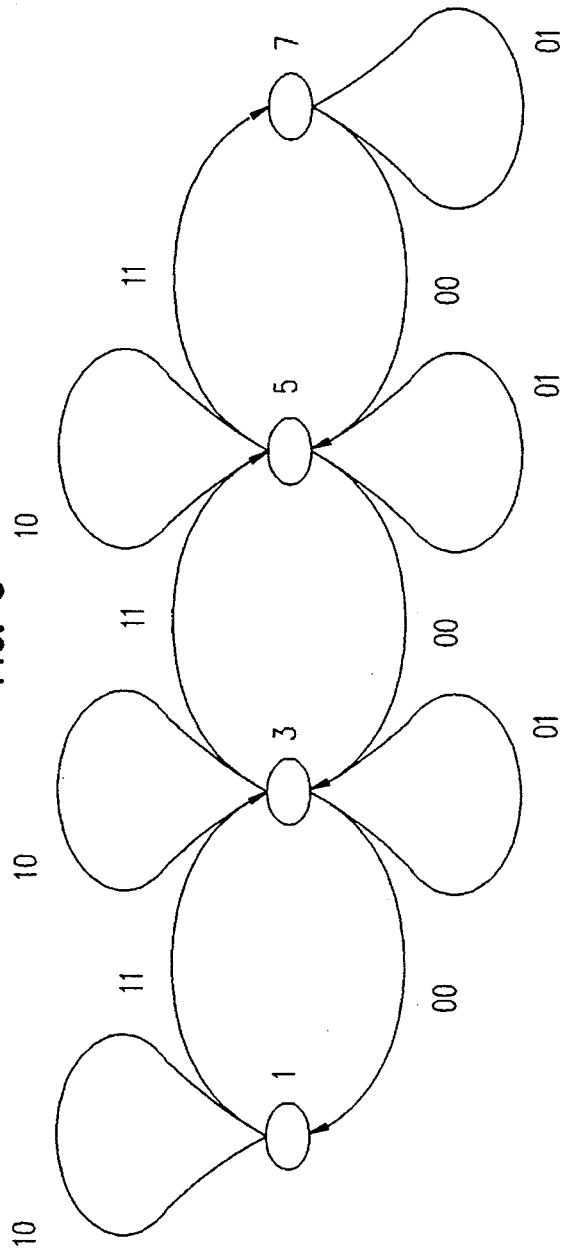
FIG. 4 shows 1 component of a $(G_7)^2$ FSTD depicted in FIG. 3.

Referring now to FIG. 3, there is depicted a $G_7$ finite state transition diagram (FSTD) for a seven state subset of a canonical FSTD used in generating spectral null coded sequences. This 7 state subset generates sequences with a DC null as described in Karabed et. al., U.S. Pat. No. 4,888,779 hereby incorporated by reference. In FIG. 4, there is shown one component of the second power of $G_7$ of the FSTD i.e. $(G_7)^2$.

To obtain the FSTD for the MSN partial response code, first, the FSTD $(G_7)^2$ is raised to 5-th power. Then, some edges are eliminated to arrive at the FSTD H depicted in FIG. 5. Here, A denotes a set of 143 edges. Each edge corresponds to a path of length 5 that starts from the state 3 and ends on the state 5 in shown in FIG. 4. Note, each edge assumes the labels of its associated path. Further, in FIG. 5, B denotes a set of 123 edges. Each edge corresponds to a path of length 5 that starts from the state 3 and ends on the state 3 in FIG. 4. The precise descriptions of the sets A and B will be set out subsequently. It should further be noted that the sets $A^c$ and $B^c$ are the complementary sets of A and B, respectively, and they contain edges that emerge out of the state 5.

Figure 5:
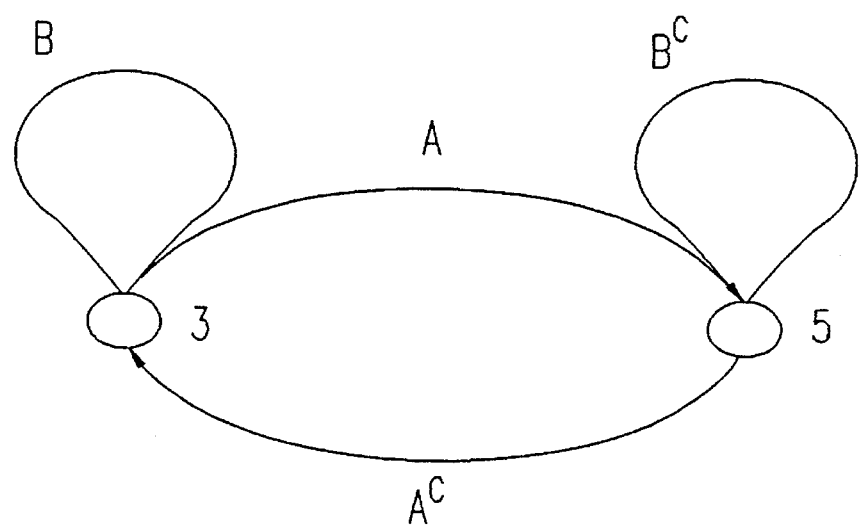
FIG. 5 sets out a FSTD of $(G_7)^2$ of FIG. 4 raised to the fifth power.

Significantly, a code trellis is derived from the trellis in FIG. 5 by deleting any 10 edges from the union of sets A and B, and deleting the complement of the 10 edges from the union of sets $A^c$ and $B^c$.

A Viterbi Detector Trellis Design For The Channel Code

Figure 6:
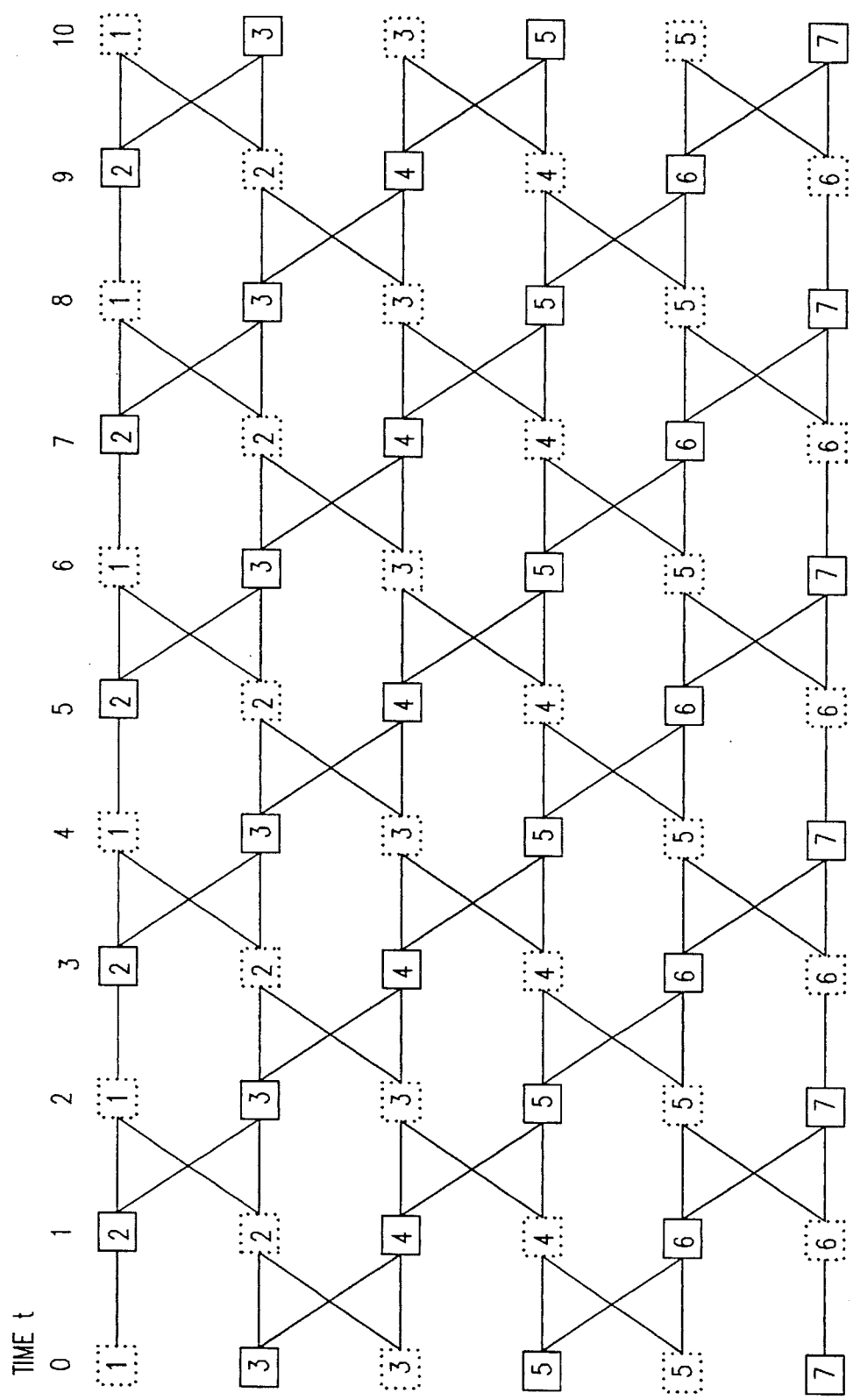
FIG. 6 illustrates a trellis combining memory of a partial response channel and spectral null coding.

Referring now to FIG. 6, there is shown the combined 1–D and $G_7$ trellis T. In this combined trellis, each state identifies with a pair of states $(s_1,s_2)$, where $s_1$ is the channel state (1–D) and $s_2$ is the charge state ($G_7$). The possible channel states are $\{1, 0\}$, and the possible charge states are $\{1, 2, 3, 4, 5, 6, 7\}$. For simplicity, in FIG. 6, each state has been denoted by a numbered square, the number corresponds to the charge state, and the outline of the box identifies the channel state. If the box has a solid outline, then the channel state is '1', and if it has a dashed outline, then the channel state is '0'.

Figure 7:
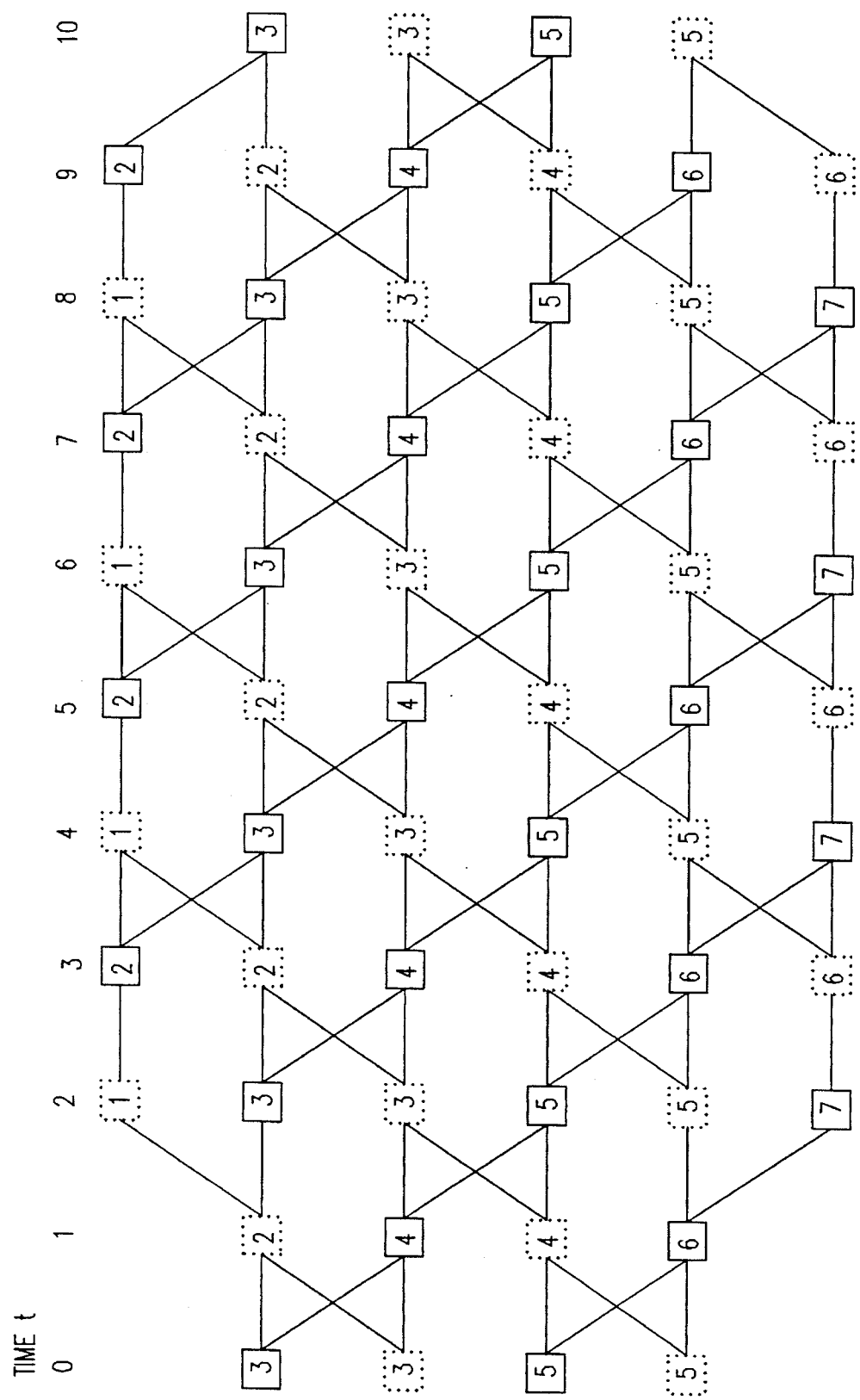
FIG. 7 depicts a primitive trellis $T_1$ that contains all spectral null code sequences with constrained charge states at 0 modulo 10 for a partial response channel including quasi-catastrophic sequences.

Referring now to FIG. 7, there is shown a trellis $T_1$ which is modified version of the trellis T in FIG. 6. However, to minimize extra edges supported by the trellis, states '1' and '7' are deleted from T every time t=0 (mod 10). Now, the resulting trellis, $T_1$ of FIG. 7, is 10-block stationary, and it will be used to represent a trellis that contains all codes sequences. Nonetheless, the trellis $T_1$ supports quasi-catastrophic sequences that give rise to a long path memory. In the context of the PR channel and coded PR channels, a Sequence.belonging to a trellis is said to be quasi-catastrophic if it can be generated by at least two distinct walks on the trellis.

Figure 8:
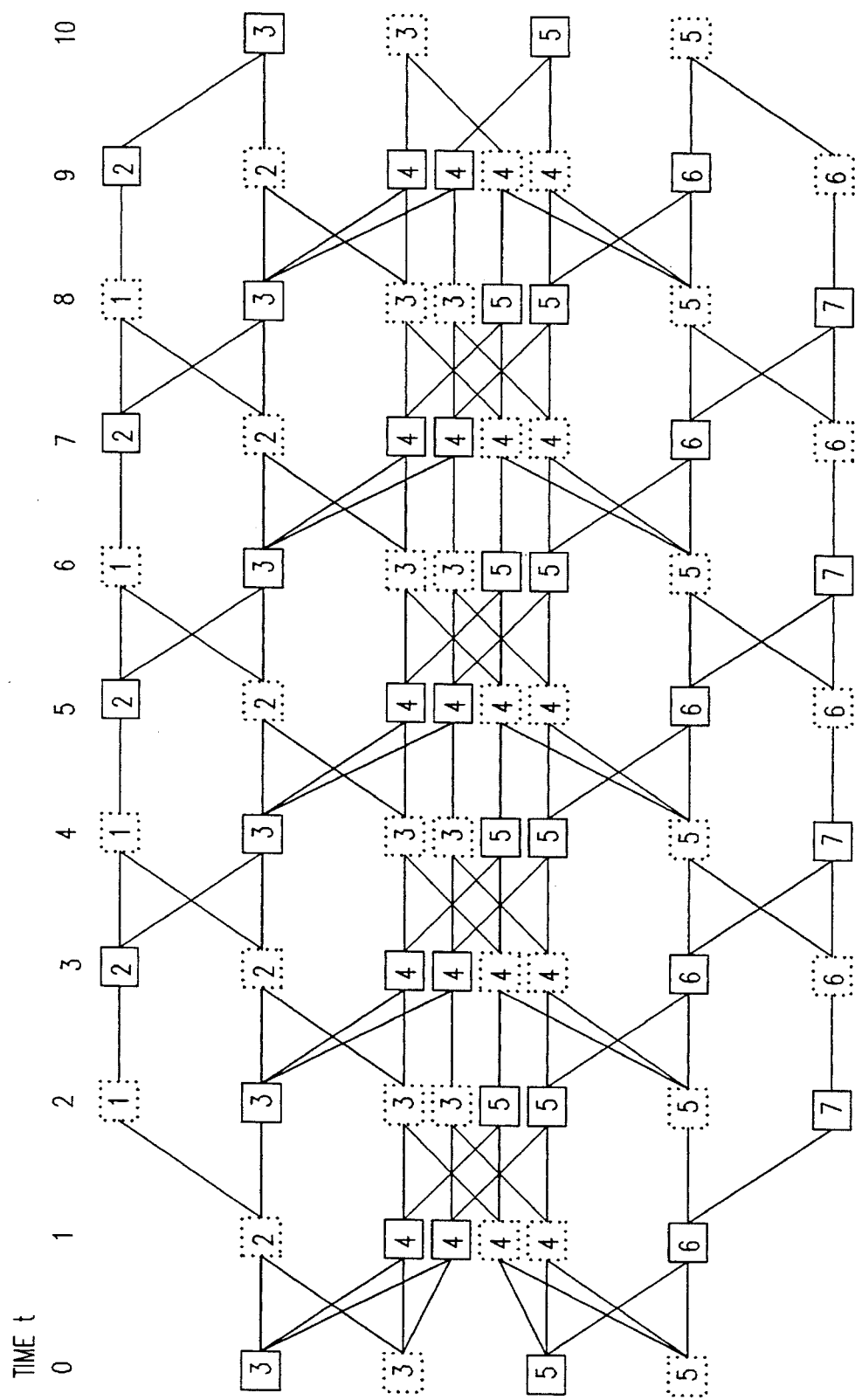
FIG. 8 shows a trellis $T_1'$ as an image of $T_1$ modified to include output splitting of selected states.

To alleviate the long path memory, quasi-catastrophic behavior can be removed from the trellis by applying the OUT-SPLIT method to $T_1$. In particular, the trellis $T'_1$ of FIG. 8 is obtained from $T_1$ through out-splitting of states (1,4) and (0,4) at all odd times, and states (0,3) and (1,5) at all even times, except times t=0 (mod 10). Next, certain edges from $T'_1$ are erased to ensure that it is free from any quasi-catastrophic sequences. The erased edges are drawn in bold lines in FIG. 9.

At this point, the sets A and B above are now defined. More particularly, from the states (1,3) and (0,3) at time t=0, there are exactly 123 paths that avoid the bold edges of FIG. 9 and end on states (1,3) or (0,3). Let B be the set of these edges. Moreover, from the same states, there are exactly 143 paths that avoid the bold edges and end on states (1,5) or (0,5). Let A be the set of these edges.

Next the parameters of the resulting code C1 are set out:
C1 Code Parameters
Rate R=8/10
Coding gain=3 dB.
Path memory for $(d=d_{min})$=22 bits.
The length of the longest minimum distance error event=21 bits.
The maximum error propagation of a minimum distance error event=21 code bits (2 user bytes).

Figure 9:
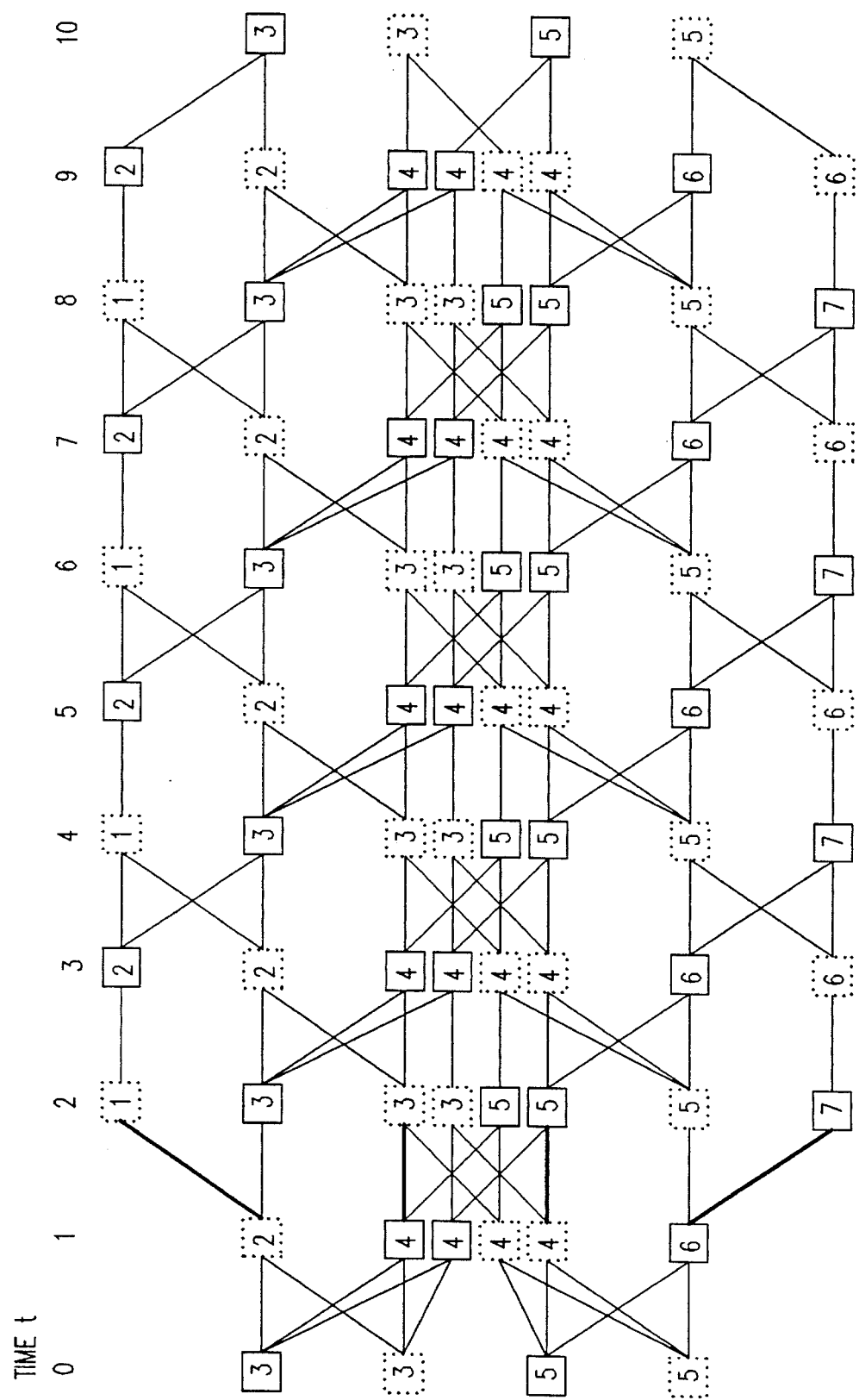
FIG. 9 illustrates a trellis T'" derived from trellis $T_1'$ of FIG. 8 by elimination of selected states and edges to ensure absence of quasi catastrophic sequences according to the invention. This includes a Viterbi detector for rate 8/10 spectral null coded PR sequences of a first kind (Code C1).
Figure 10:
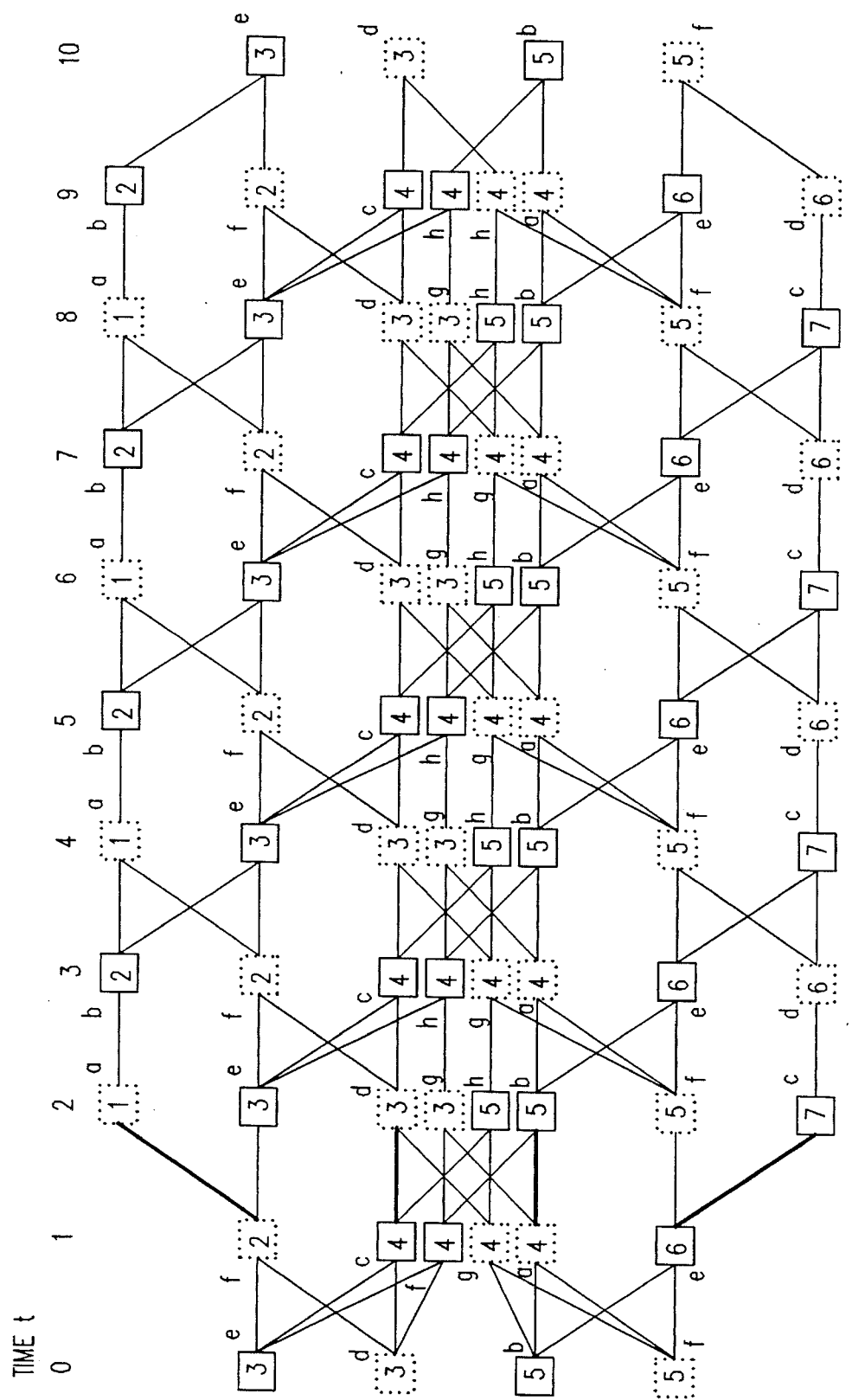
FIG. 10 sets out an assignment of ACS units designated by lower case a-h in the trellis T'" that apply efficient routing attributes in the Viterbi detector of FIG. 1B.

In the implementation of the Viterbi detector for the trellis $T_1''$ of FIG. 9, there is an interesting assignment of states to Add-Compare-Select (ACS) units that makes an efficient use of routing. Specifically, having eight ACS units denoted by the letters a, b, c, d, e, f, g and h, FIG. 10 illustrates such an assignment.

The Code C2 Design

Figure 11:
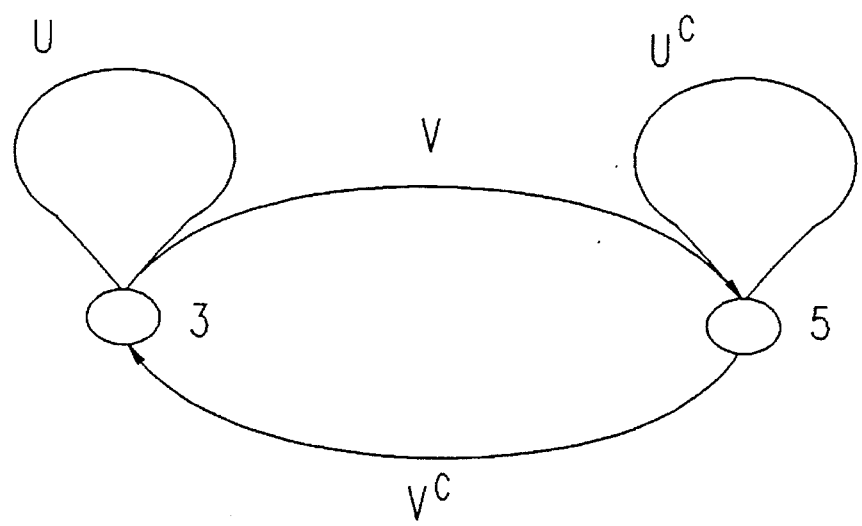
FIGS. 11 and 12 respectively depict a FSTD of $(G_7)^2$ of FIG. 4 raised to the fifth power modified by elimination of selected edges, and, a trellis $T_1'$ similar to the one shown in FIG. 9 modified to code a Viterbi detector for rate 8/10 spectral null coded PR sequences of a second kind (Code C2).

To obtain the code C2 FSTD, the FSTD $(G_7)^2$ of FIG. 4 again is raised to 5-th power. Then, some edges are eliminated to arrive at the FSTD depicted in FIG. 11. As for the code C1, descriptions of the sets U and V are deferred. It suffices to mention that there will be exactly 256 edges in the union of the sets U and V. Therefore, FIG. 11 is the code C2 trellis, and no edge deletion is required.

The Viterbi Detector for Code C2

Figure 12:
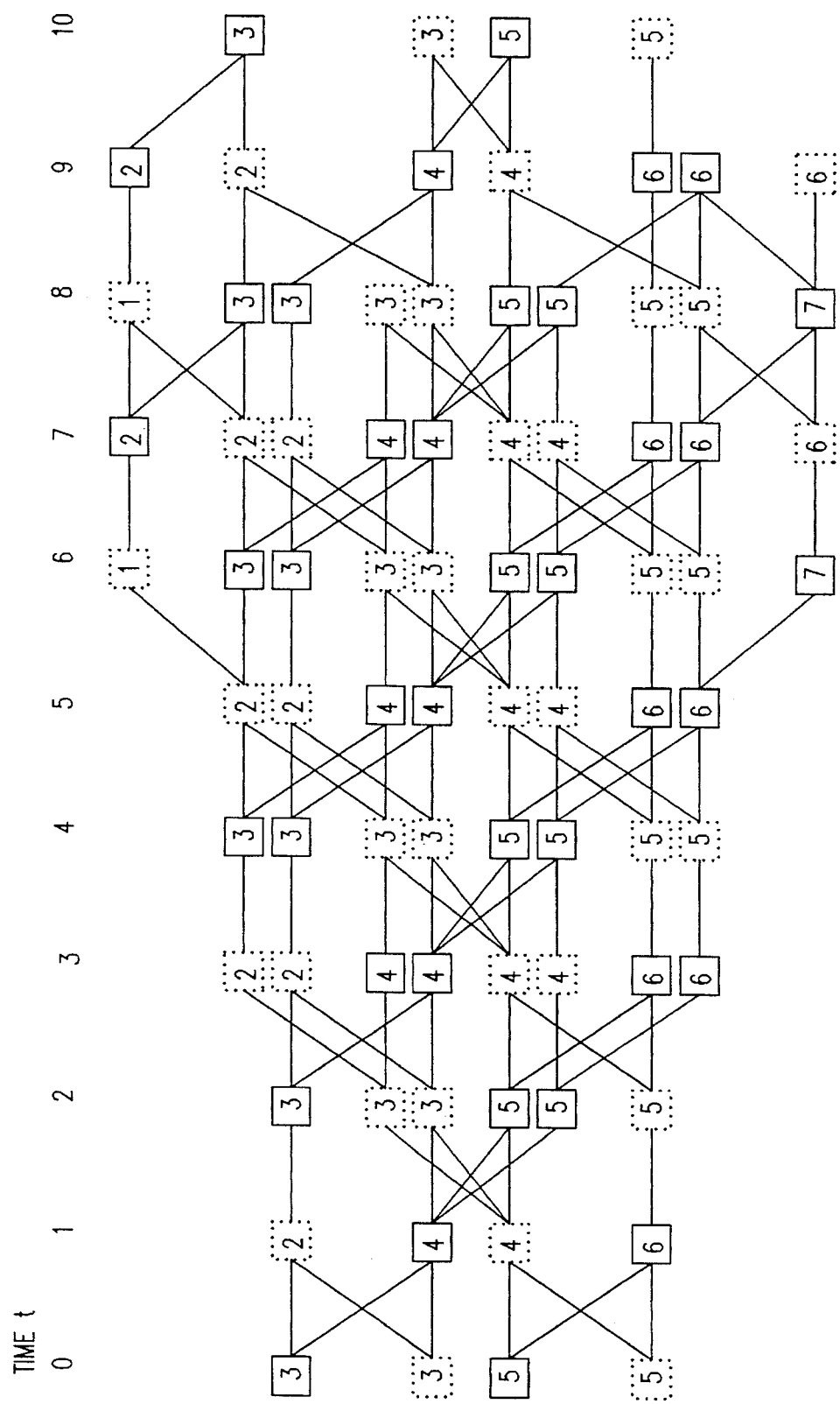

For the code C2, starting from the trellis $T_1$ of FIG. 7, the trellis $T'_1$ of FIG. 12 is obtained by out-splitting of states and elimination of edges. Similar to the trellis $T_1''$ of FIG. 9, the trellis of FIG. 12 does not support any quasi-catastrophic sequences.

Using the trellis of FIG. 12, U is defined to be the set of all paths starting from the state (1,3) at time t=0 and ending on the states (0,3) and (1,3) at time t=10. Next, V is defined to be the set of all paths starting from the state (1,3) at time t=0 and ending on the states (0,5) and (1,5) at time t=10. Note that as mentioned above, the total number of edges in U and V is 256.

The parameters of the resulting code C2 are:
C2 Code Parameters
Rate R=8/10.
Coding gain=3 dB.
Path memory for $(d=d_{min})$=22 bits
The length of the longest minimum distance error event= 20 bits. The maximum error propagation of a minimum distance error event=20 code bits (2 user bytes).
C1 and C2 Codes Compared (1) The Viterbi detector trellis $T_1'$ of FIG. 12 is an optimum detector trellis for the code C2, in the sense that it supports only code sequences. In contrast, the Viterbi detector trellis $T_1$ of FIG. 9, supports 10 extra paths over the 10 bit span. Although, the optimum trellis might have a slightly better error probability, nevertheless, that gain normally is very small. In addition, often a communication system becomes sensitive to a certain code sequence. To be able to substitute for the sensitive code sequence, it is desirable to have a few extra sequences supported by the detector trellis.

(2) The code parameters of the two codes are the same except the longest minimum distance error event is 20 bits long for the code C2, while this length is 21 bits for the code C1. But since the maximum error propagation of a minimum distance error event is 2 user bytes for both codes, the error correction requirements should be roughly the same. Another observation that might lead to the same conclusion is that both C1 and C2 have path memory of 22 bits.

Extensions

The Code C3 Design

One extension to the method and means of this invention is in terms of an additional code and detector design. That is, for a code C3, this is the same as for the code C2, except the sets U and V are different, and they do not add up to 256 edges.

The Viterbi Detector for Code C3

Figure 13:
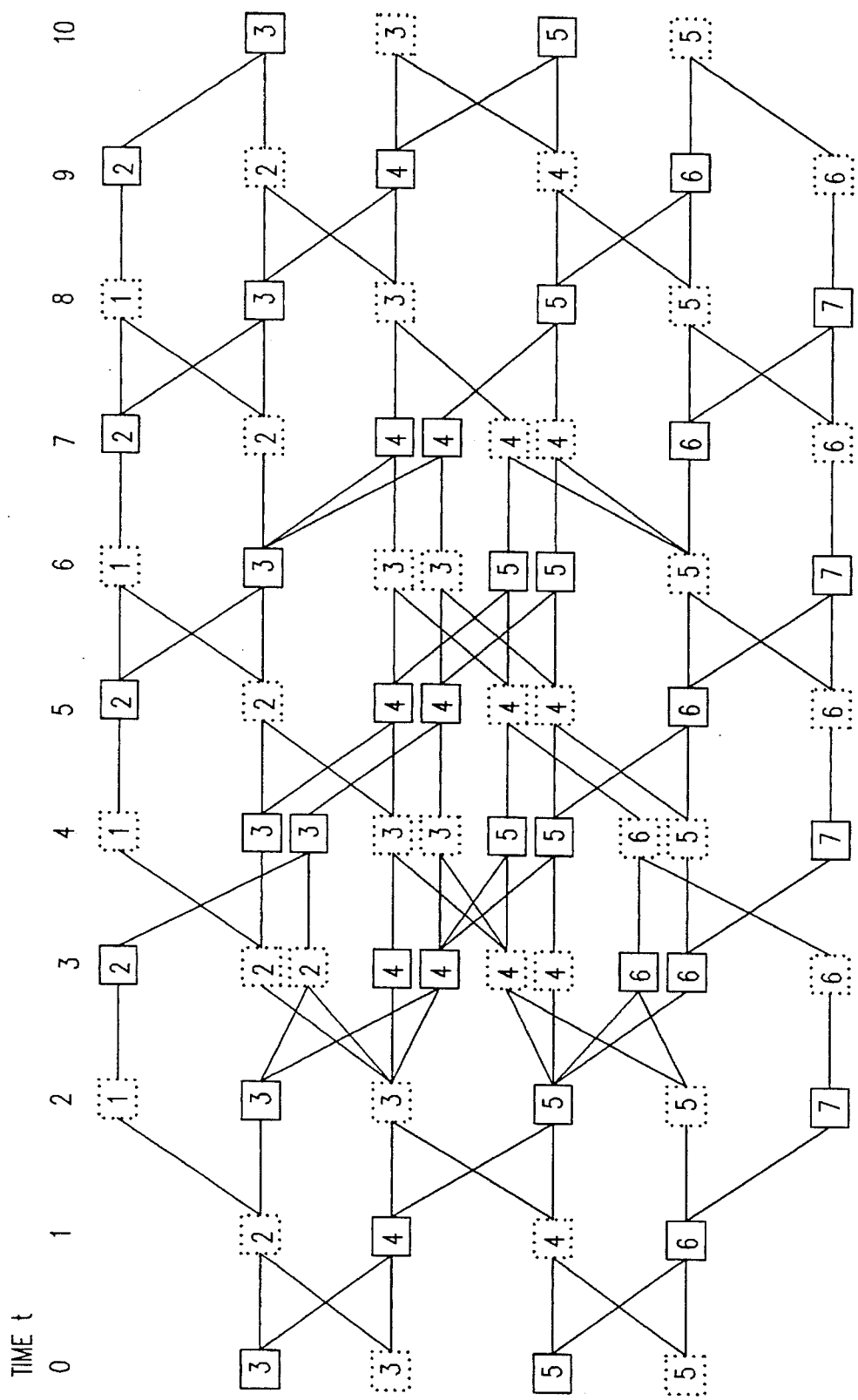
FIG. 13 sets forth a trellis $T_1'$ as an image of trellis $T_1$ depicted in FIG. 7 modified to code a Viterbi detector for rate 8/10 spectral null coded PR sequences of a third kind (Code C3).

For the code C3, starting from the trellis $T_7$ of FIG. 7, the trellis $T'_1$ of FIG. 13 is obtained by out-splitting of states and elimination of edges. The sets U and V have the same membership as previously using the trellis of FIG. 13. Now, the following is a list of parameters of the resulting code C3.
C3 Code Parameters
Rate R=8/10.
Coding gain=3 dB
Path memory for $(d=d_{min})$=23 bits.
The length of the longest minimum distance error event= 22 bits. The maximum error propagation of a minimum distance error event=22 user bits (3 user bytes).

These and other extensions of the invention may be made without departing from the spirit and scope thereof as recited in the appended claims.

We claim:

1. A method for detecting spectral null sequences of a spectrally-constrained code from data samples in the form of digital electrical signals generated at the output of a noisy communications channel, comprising the steps of:

(a) tracking the spectral content of said sequences of electrical signals with a Viterbi detector, the processing of said sequences by the Viterbi detector being governed according to an N stage trellis structure, each trellis stage including a plurality of states and edges; and (b) mapping each spectral null sequence to a unique path of acyclic successive states and edges through said trellis by selectively output splitting counterpart states and pruning preselected states and edges at preselected times modulo N in said trellis such that no pair of unique paths support the same spectral null sequence.

2. The method according to claim 1, wherein said method further comprises the step of:

(c) recursively applying steps (a) and (b) creating thereby a time-varying trellis structure for limiting the maximum length of dominant error events in said sequences.

3. An apparatus for enhancing the detectability of spectral null sequences of a spectrally constrained code from digital electrical signals representing binary data, comprising:

an encoder responsive to the digital electrical signals for generating spectral null sequences according to a time varying trellis T', trellis T' being the image of states and edges from a primitive trellis T, T' being constrained such that a subset of the states in trellis T' is selectively outsplit at various times t from counterpart states in T and such that preselected edges in T' supportive of quasi-catastrophic spectral null sequences are deleted; and means coupling the encoder for recording or communicating the sequences over a partial response channel.

4. The apparatus according to claim 3, wherein the states and edges in said trellis T' being arranged such that each spectral null sequence is mapped to a unique path of acyclic successive states and edges, and no pair of unique paths support the same spectral null sequence.

5. An apparatus for enhancing the detectability of spectral null sequences of a spectrally constrained code from digital electrical signals representing binary data, comprising:

an encoder responsive to the digital electrical signals for generating spectral null sequences according to a time varying trellis T', T' being the image of a primitive trellis T of predetermined states and connecting edges, T' being formed by outsplitting selective ones of the states at a time t in trellis T, each selected state s being replaced by two states s' and s", reproducing in T' the in-directed edges of s for both states s' and s", partitioning the out-directed edges of s in T' into two sets assigning a first set to state s' and a second set to state s, and deleting preselected edges in T' supportive of quasi-catastrophic spectral null sequences; and means coupling the encoder for recording or communicating the sequences over a partial response channel.

6. The apparatus according to claim 5, wherein the code is a rate 8/10 spectrally constrained code having a spectral density null.

7. The apparatus according to claim 5, wherein said apparatus includes means for interleaving digital electrical signals from at least a pair of signal sources and for applying said interleaved digital signals to the encoder, the sequences so encoded being both DC free and Nyquist free.

8. The apparatus according to claim 5, wherein the states and edges in said trellis T' being arranged such that each spectral null sequence is mapped to a unique path of acyclic successive states and edges, and no pair of unique paths support the same spectral null sequence.

9. A method for detecting a spectral null sequence of a spectrally constrained code, comprising the steps of:

(a) generating said spectral null sequence by an encoder from digital electrical signals representing unencoded input data and recording said spectral null sequence on a storage device over a partial response channel subject to noise;

(b) reading said spectral null sequence back from said storage device at an output of the partial response channel; and (c) applying said read back spectral null sequence to a Viterbi detector;

(d) at the Viterbi detector, tracking the spectral content of candidate survivor spectral null sequences, and selecting the candidate survivor sequence evidencing the smallest accumulated distance from the read back sequence, said tracking including recursively mapping the read back spectral null sequence into candidate survivor sequences via a time varying trellis T', T' being the image of a primitive trellis T of predetermined states and connecting edges, T' being formed by outsplitting selective ones of the states at a time t in trellis T, each selected state s being replaced by two states s' and s", reproducing in T' the in-directed edges of s for both states s' and s", partitioning the out-directed edges of s in T' into two sets, assigning a first set to state s' and a second set to state s, and deleting preselected edges in T' supportive of quasi-catastrophic spectral null sequences.

10. A method for detecting a spectral null sequence of a spectrally constrained code, comprising the steps of:

(a) generating said spectral null sequence by an encoder from digital electrical signals representing unencoded input data and recording said spectral null sequence on a storage device over a partial response channel subject to noise;

(b) reading said spectral null sequence back from said storage device at an output of the partial response channel; and, (c) applying said read back spectral null sequence to a Viterbi detector;

(d) tracking the spectral content of said read back sequence with the Viterbi detector, the processing of said sequence by the Viterbi detector being governed according to an N stage trellis structure, each trellis stage including a plurality of states and edges; and (e) mapping the read back sequence to a unique path of acyclic successive states and edges through said trellis by selectively outsplitting counterpart states at preselected times modulo N in said trellis such that no pair of unique paths support the same spectral null sequence.

11. the method according to claim 10, wherein said method further comprises the steps of:

(f) recursively applying steps (d) and (e) creating thereby a time-varying trellis structure for limiting the maximum length of dominant error events in said sequences.

* * * * *